United States Patent [19]

Lobb et al.

[11] Patent Number: 4,792,704

[45] Date of Patent: Dec. 20, 1988

[54] SCALED VOLTAGE LEVEL TRANSLATOR CIRCUIT

[75] Inventors: Kenneth G. Lobb, Rochester; Timothy J. Schmerbeck, Kasson; Brian A. Schuelke, Rochester, all of Minn.; Manning O. Sutton, San Francisco, Calif.

[73] Assignee: International Business Machines Corporation, Armonk, N.Y.

[21] Appl. No.: 45,348

[22] Filed: May 1, 1987

[51] Int. Cl.[4] .......................... H03K 5/08; H03K 6/00
[52] U.S. Cl. .................................. 307/264; 307/475; 307/310; 307/491
[58] Field of Search ............... 307/264, 310, 475, 491

[56] References Cited

U.S. PATENT DOCUMENTS

| | | | |
|---|---|---|---|
| 4,456,838 | 6/1984 | Taguchi et al. | 307/264 |
| 4,578,602 | 3/1986 | West et al. | 307/264 |
| 4,647,793 | 3/1987 | Davis | 307/264 |

Primary Examiner—John Zazworsky
Attorney, Agent, or Firm—J. Michael Anglin

[57] ABSTRACT

A circular translates an input signal about an input reference voltage to an output signal referenced to a different voltage. The input signal may be scaled, and multiple inputs may be scaled independently and summed. Shift networks transfer the input signal across a resistor on the input of a current mirror; the output signal appears across a resistor in an output of the mirror.

15 Claims, 2 Drawing Sheets

SCALED VOLTAGE LEVEL TRANSLATOR CIRCUIT

BACKGROUND OF THE INVENTION

The present invention relates to semiconductor circuits, and more particularly concerns circuits for translating a voltage from one reference-voltage level to another.

It is frequently necessary to translate an electrical input signal having a swing about a first unvarying reference or bias voltage to an output voltage having the same swing about a second unvarying reference or bias voltage. That is, the input signal voltage must be translated from one DC level to another, either without changing the magnitude of the signal swing, or with a precisely known ratio between input and output swings. It is also frequently necessary to sum a number of such translated signals together to form a composite output signal.

Many applications require that the translation and other operations be accomplished very precisely and at very high speed. One application which stresses the state of the art in this area involve shifting an AGC (automatic gain control) voltage referenced to ground to a signal referenced to a 6-volt supply voltage; another is the translation of a DAC (digital-to-analog converter) signal referenced above ground to a signal centered about a six-volt supply voltage.

Typical conventional circuits would translate signals with a combination of operational amplifiers and passive components. Such circuits suffer from reduced bandwidth, offset-voltage errors, and large numbers of components. U.S. Pat. No. 3,778,640 (Platt, et al.) teach a simpler circuit for logic voltage-level translation, but one which still suffers from offset errors, and which requires that the input signal voltage be within a restricted range. The gain through this circuit is highly temperature dependent, and has a wide tolerance.

SUMMARY OF THE INVENTION

The present invention provides a voltage-level translating circuit which is accurate, fast, simple, and inexpensive to produce. High accuracy, even over wide temperature ranges, is achieved with a small number of components having easily matched parameters. The input and output reference voltages may have arbitrary levels add polarities with respect to the input and output signal voltages, and with respect to each other. The circuit accommodates wide swings in the input and output signal voltages.

The circuit can be further simplified if the input signal is always above or always below the input reference voltage. The output signal swing can be accurately scaled (amplified or attenuated) with respect to the input swing. Multiple input signals can be translated, scaled, and summed together with little added complexity; each of the input signals can be tied to a different reference voltage (different level and/or polarity), and scaled by a different factor.

Broadly speaking, a basic circuit according to the invention has a current mirror, a shift network coupled to a mirror output and to the input signal, and another shift network connected to the first network, to the input of the current mirror, and to a resistor for reproducing the input signal voltage. The output voltage is taken across a matched output resistor in another output of the current mirror. Two dual circuits can be combined to handle input signals of both polarities. Multiple circuits can be fed into a common output resistor for summing multiple translated input signals.

DESCRIPTION OF A PREFERRED EMBODIMENT

Figure 1:
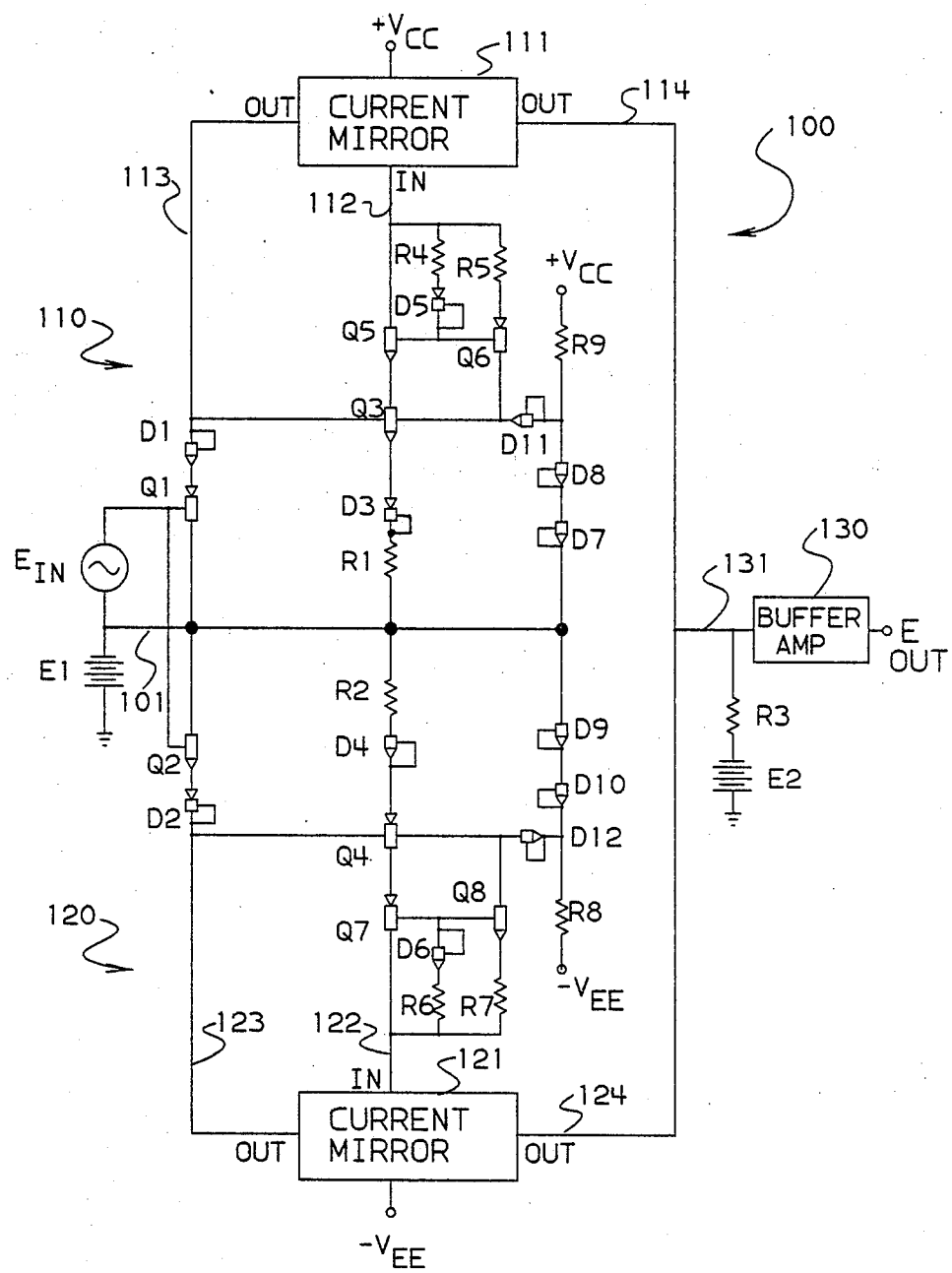
FIG. 1 is a schematic diagram of a circuit according to the invention.

Circuit 100, FIG. 1, accepts an input signal voltage Ein which is offset from a common ground potential by a constant input reference voltage E1. Ein may be either unipolar or bipolar, and E1 may be either positive or negative with respect to ground. The circuit produces an output signal voltage Eout which is scaled in magnitude from Ein by a factor k selectable by the designer, and is offset from the common ground potential by a constant output reference voltage. E2 may be positive or negative with respect to ground, and need have no particular relationship to the magnitude or polarity of E1.

Circuit 100 is made up of two halves 110 and 120, which operate as duals of each other. Circuit half 110, which includes those components above line 101 in FIG. 1, scales and translates all input signal voltage levels Ein above reference voltage E1 to an output signal voltage Eout=kEin above reference voltage E2. If Ein never falls below the level of E1, circuit half 120 may be omitted. Circuit half 120, comprising the components below line 101, operates in a corresponding manner for levels of Ein below E1. If Ein always remains below the level of E1, circuit half 110 is not necessary. Components E1, E2, R3, and 130, however, are required even if one of the circuit halves is omitted.

PNP transistor Q1 and NPN diode D1 shift Ein at the base of Q1 upward in voltage by one PNP Vbe drop and one NPN Vbe drop. This shifted voltage appears at the base of Q3, whence it is shifted downward by one NPN Vbe drop at the emitter of NPN transistor Q3, and downward again by one PNP Vbe through PNP diode D3. The Vbe voltages and forward current gains of Q1 and D3 are matched, as are those of D1 and Q3. Constructing these devices with similar geometries and in close proximity on a single semiconductor chip renders the errors insignificant. If the current in Q1-D1 equals the current in Q3-D3, then the Vbe drops cancel out, and the voltage across resistor R1 is exactly Ein.

The current required to sustain this drop is coupled to a conventional current mirror 111 at its input terminal 112. The mirror receives power from a positive supply voltage Vcc. Mirror circuit 111 produces currents flowing out of its output terminal 113 and 114 each equal to the current flowing out of its input terminal 112. The current from output 114 flows through resistor R3 and then to ground through E2. If the resistance of R3 is closely matched to that of R1, the input signal Ein then also appears across R3. Conventional buffer amplifier 130 produces a low-impedance version of the voltage across R3 as Eout. Buffer 130 may have a gain other than unity, in order to scale Eout in magnitude from Ein. Scaling may also be accomplished by making the ratio R3/R1 other than unity, (i.e., R3=kR1) or by constructing current mirror 111 such that the ratio of the current out of terminals 114 and 112 is other than unity. (The current ratio between terminals 113 and 112 must always be unity, however.)

Compensation network Q5-Q6-D5-R4-R5 cancels the base current loss of Q5 at its collector and for the base current loss from the Q1-D1 shift network in the mirrored current. Itself a current mirror, it does this by forcing the current through Q3 to equal the current through D1. Current mirrored through Q6 from D5 is equal to the base current of Q5. Thus, the current flowing out of the collector of Q6 cancels the base current flowing into Q3 from line 113. Compensating for this base current causes a closer match between the currents flowing in D1 and in Q3, thus increasing the match between their Vbe drops.

Start-up network D7-D8-D11-R9 is connected to the Vcc supply terminal and to line 101. It assures that the shift circuits Q1-D1 and Q3-D3 do not latch up in a stable nonconducting state when power is first applied. When power is first applied, Vcc through R9 turns on D7 and D8. This turns on D11, which pulls up the base of Q3, ensuring that it turns on. This in turn causes the base of Q3 to rise to a still higher voltage, which turns off D11. After circuit 100 has stabilized, D11 remains reverse-biased, and this network has no further effect. R9 should be large enough to prevent excessive current drain while circuit 100 is operating.

The dual circuit half 120 works the same way as half 110, mutatis mutandis for the NPN and PNP transistors and diodes. Current mirror 121 has currents flowing into its input terminal 122 and both outputs 123 and 124. Thus, for input signal levels Ein below the voltage of E1, the voltage across resistor R2 equals that across R3, so that these resistors must be matched in value. Again, this is simple to do by fabricating all three resistors R1, R2, R3 with similar geometry near each other on the same semiconductor die. Scaling the positive and negative halves of the Ein/Eout ratio differently may also be accomplished if desired, merely by making R1/R2 different from unity.

Figure 2:
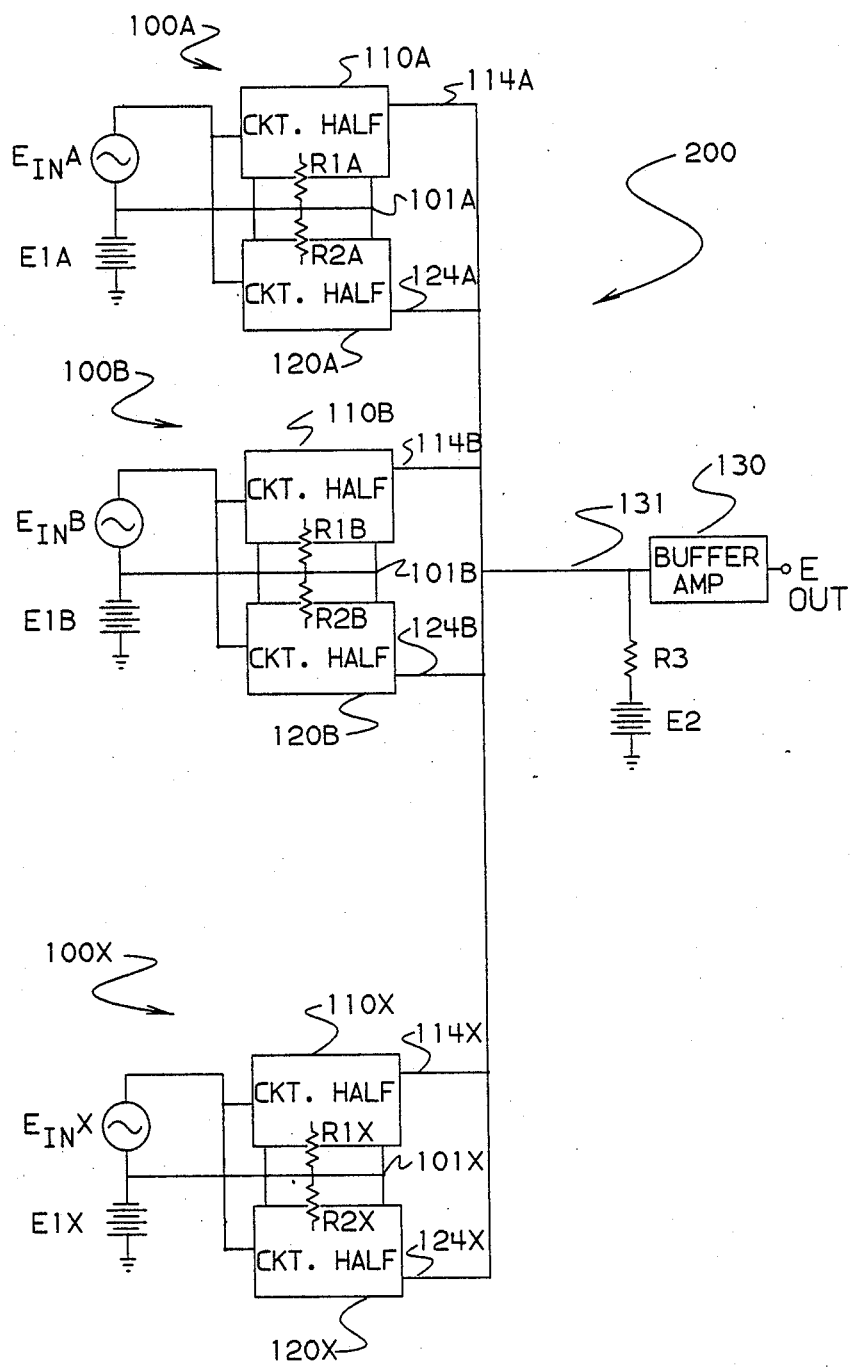
FIG. 2 shows multiple circuits connected for summing input signals.

FIG. 2 shows a circuit 200 for translating, summing, and summing multiple input signals. Circuits 100A, 100B, ..., 100X are copies of circuit 100, FIG. 1. Each copy has its own input signal voltage EinA, EinB, ..., EinX. The corresponding input reference voltages E1A, E1B, ..., E1X may differ from each other in magnitude and polarity.

The current-mirror outputs 114A–114X correspond to output 114, FIG. 1; outputs 124A–124X correspond to output 124. All of these output currents connect to a common bus and thence to input 131 of a single buffer amplifier 130. If all the resistors shown in FIG. 2 are equal, then the output voltage Eout is the sum of all the input signal voltages EinA–EinX, about the single output reference voltage E2. For the more general case where $R3=kA*R1A=kB*R1B=...=kX*R1X$, $Eout=kA*EinA+kB*EinB+...+kX*EinX$. In this way, many input signals can be translated from arbitrary different input reference voltages to the same output reference voltage and summed together at the same time, with no additional circuitry.

Having described a preferred embodiment thereof, we claim as our invention:

1. A circuit for translating an input signal voltage in series with an input reference voltage to an output signal voltage in series with an output reference voltage with respect to a ground potential, comprising:
   a current mirror having an input and first and second outputs;
   a first shift network coupled to said first current-mirror output and to said input signal voltage for translating said input signal voltage in a first direction by a predetermined amount to produce a shifted signal voltage;
   a second shift network including an input-dropping resistor, said second shift network being coupled to said current-mirror input and to said first shift network for translating said shifted signal voltage in a direction opposite said first direction and by said predetermined amount so as to produce a replica of said input signal voltage across said input-dropping resistor;
   an output-dropping resistor coupled to said second current-mirror output, and further coupled in series with said output reference voltage, said output-dropping resistor being matched to said input-dropping resistor for producing said output voltage thereacross.

2. The circuit of claim 1, wherein said first shift network comprises:
   a transistor having a first conductivity type coupled to said input signal voltage;
   a diode having a second conductivity type coupled to said transistor and to said current mirror.

3. The circuit of claim 2, wherein said second shift network comprises:
   a transistor having said second conductivity type coupled to said first shift network and to said current source;
   a diode having said first conductivity type coupled to said last-named transistor and to said input-dropping resistor.

4. The circuit of claim 1, wherein the resistance of said input-dropping resistor equals the resistance of said output-dropping resistor.

5. The circuit of claim 1, wherein the resistance of said input-dropping resistor has a predetermined nonunity ratio to the resistance of said output-dropping resistor.

6. The circuit of claim 1, further comprising a compensation network for cancelling current flowing between said first and second shift networks.

7. The circuit of claim 1, further comprising a start-up network for inhibiting latch-up of at least one of said shift networks.

8. The circuit of claim 1, further including a buffer amplifier coupled to said output-dropping resistor for minimizing current flow to said output signal voltage.

9. The circuit of claim 1, further comprising a dual circuit coupled to said input signal voltage and to said output-dropping resistor, said dual circuit having a further input-dropping resistor matched to said first input-dropping resistor and to said output-dropping resistor.

10. The circuit of claim 1, further including a buffer amplifier coupled to said output-dropping resistor for minimizing current flow to said output signal voltage.

11. The circuit of claim 10, wherein the resistance of said second input-dropping resistor has a predetermined ratio to the resistance of said first input-dropping resistor.

12. The circuit of claim 10, wherein said predetermined ratio is unity.

13. A circuit for translating and summing at least first and second input signal voltages in series with first and second reference voltages, respectively, to produce an output sum signal voltage in series with an output reference voltage with respect to a ground potential, comprising:

at last first and second circuits, each including
a current mirror having an input and first and second outputs,
a first shift network coupled to said first current-mirror output and to said input signal voltage for translating said input signal voltage in a first direction by a predetermined amount to produce a shifted signal voltage,
a second shift network including an input-dropping resistor, said second shift network being coupled to said current-mirror input and to said first shift network for translating said shifted signal voltage in a direction opposite said first direction and by said predetermined amount so as to produce a replica of said input signal voltage across said input-droping resistor;

an output-dropping resistor coupled to said second current-mirror outputs of both said first and said second circuits, and further coupled in series with said output reference voltage, said output-dropping resistor being matched to said input-dropping resistors of said first and second circuits for producing said output sum signal voltage thereacross.

14. The circuit of claim 13, wherein at least one of said first and second circuits further comprises a dual circuit coupled to one of said input signal voltages and to said output-dropping resistor, said dual circuit having a further input-dropping resistor matched to said first input-dropping resistor and to said output-dropping resistor.

15. The circuit of claim 13, further including a buffer amplifier coupled to said output-dropping resistor for minimizing current flow to said output sum signal voltage.

* * * * *